(12) United States Patent
Bisson et al.

(10) Patent No.: US 9,573,803 B2
(45) Date of Patent: Feb. 21, 2017

(54) ASSEMBLY OF FLAT ON STRUCTURED GLASS LAYERS

(75) Inventors: Antoine Gaston Denis Bisson, Montigny Lencoup (FR); Thierry Luc Alain Dannoux, Avon (FR); Anne Paris, Thomery (FR)

(73) Assignee: Corning Incorporated, Corning, NY (US)

( * ) Notice: Subject to any disclaimer, the term of this patent is extended or adjusted under 35 U.S.C. 154(b) by 0 days.

(21) Appl. No.: 13/522,388

(22) PCT Filed: Jan. 28, 2011

(86) PCT No.: PCT/US2011/022849
§ 371 (c)(1),
(2), (4) Date: Jul. 16, 2012

(87) PCT Pub. No.: WO2011/094486
PCT Pub. Date: Aug. 4, 2011

(65) Prior Publication Data
US 2012/0288417 A1 Nov. 15, 2012

(30) Foreign Application Priority Data
Jan. 29, 2010 (FR) .................... 10 50631

(51) Int. Cl.
*B01J 19/00* (2006.01)
*B81C 1/00* (2006.01)

(52) U.S. Cl.
CPC ........ *B81C 1/00119* (2013.01); *B01J 19/0093* (2013.01); *B01J 2219/0086* (2013.01);
(Continued)

(58) Field of Classification Search
CPC .......... A01N 59/00; A01N 37/16; B01J 19/00; B01J 8/00; B01J 19/0046; B01J 19/0093; B01J 2219/00585; B01J 2219/0783; B01J 2219/00873; B01J 2219/0086; B01J 2219/00781; B01J 2219/00783; B01J 2219/00786; B01J 2219/00801; B01J 2219/00804; B01J 2219/00806; B01J 2219/00808; B01J 2219/00819; B01J 2219/00822; B01J 2219/008224; B01J 2219/00831; B01J 2219/00835; B01J 2219/00837; B01J 2219/00869; B01J 2219/00871; B82Y 40/00; C40B 60/14; C07C 263/10; C07C 51/235; C01B 2203/023
(Continued)

(56) References Cited

U.S. PATENT DOCUMENTS 7,591,947 B2 * 9/2009 Caze et al. ................ 210/510.1
2004/0234378 A1 * 11/2004 Lovette et al. ............... 417/48
(Continued)

FOREIGN PATENT DOCUMENTS

CN 1913960 A 2/2007 ............. B01J 19/00
CN 101479032 A 7/2009 ............. B01J 19/00
(Continued)

*Primary Examiner* — Natasha Young

(57) ABSTRACT

A microfluidic device (100) made from glass, ceramic or vitroceramic, comprises an upper layer (122), a lower layer (124) and an intermediate layer (114), the intermediate layer (114) comprising an upper face (114*b*) and a lower face (114*a*), the lower face (114*a*) comprising a first open structured surface defining a first microfluidic channel (126) and the upper face (114*b*) comprising a second open structured surface defining a second microfluidic channel (112); the lower surface of the intermediate layer (114) cooperating with a first planar layer closing the first microchannel (126); the upper face (114*b*) of the intermediate layer (114) cooperating with a second planar layer (130), closing the second microfluidic channel (112) in a sealed manner, and the second planar layer constituting an intermediate layer (130)

(Continued)

which cooperates, on its face opposite the intermediate layer (114), with another layer (122) comprising on its inner face (122*a*) a structured surface defining a third microfluidic channel (128).

9 Claims, 1 Drawing Sheet

(52) U.S. Cl.
CPC .............. *B01J 2219/00783* (2013.01); *B01J 2219/00824* (2013.01); *B01J 2219/00831* (2013.01); *B01J 2219/00873* (2013.01); *B81B 2201/058* (2013.01); *B81C 2201/019* (2013.01)

(58) Field of Classification Search
USPC .................... 422/129, 130, 240, 600, 603
See application file for complete search history.

(56) References Cited

U.S. PATENT DOCUMENTS

| | | | |
|---|---|---|---|
| 2005/0129580 A1* | 6/2005 | Swinehart et al. | 422/100 |
| 2007/0154666 A1 | 7/2007 | Coonan et al. | 428/34.4 |
| 2008/0230951 A1 | 9/2008 | Dannoux et al. | 264/293 |

FOREIGN PATENT DOCUMENTS

| | | | | |
|---|---|---|---|---|
| CN | 101580227 A | 11/2009 | ............. | C01B 3/32 |
| EP | 1964817 A1 | 2/2007 | ............. | C03B 11/08 |
| WO | 2007/025519 A2 | 3/2007 | ............. | B29C 59/02 |
| WO | 2007/079072 | 7/2007 | ............. | B01D 71/04 |

\* cited by examiner

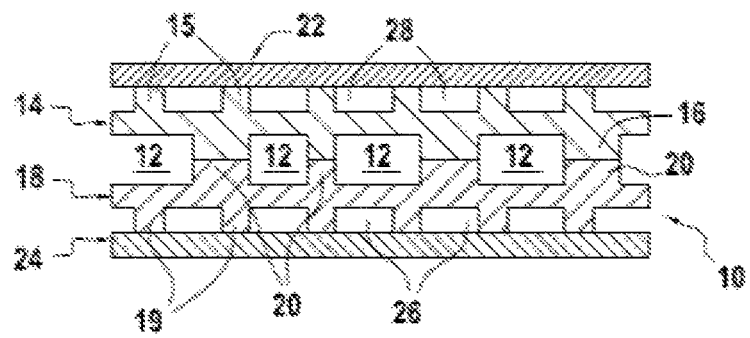
FIG.1
Prior Art
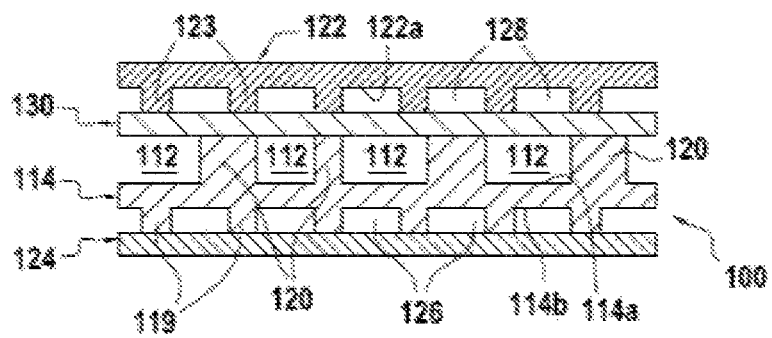
FIG.2
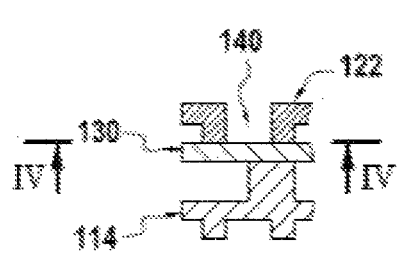 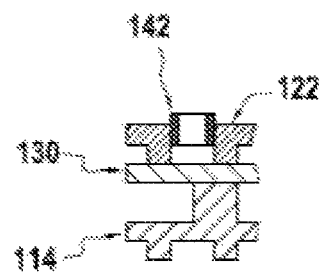
FIG.3  FIG.4  FIG.5
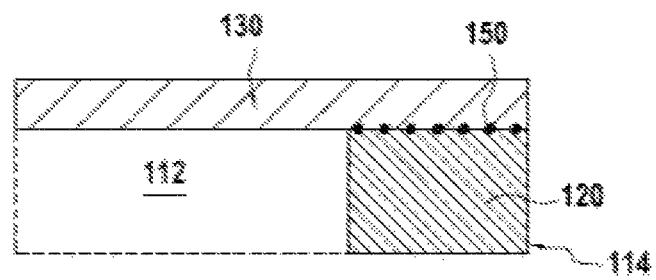
FIG.6
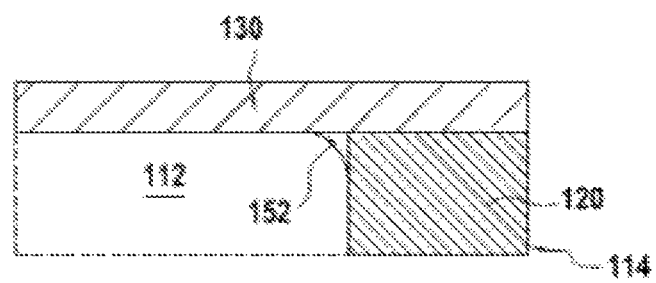
FIG.7

ASSEMBLY OF FLAT ON STRUCTURED GLASS LAYERS

This application claims the benefit of priority of French Application No. 1050631 filed on Jan. 29, 2010.

FIELD

This disclosure relates to microfluidic devices made from glass, ceramic or vitroceramic, comprising an intermediate layer comprising at least one face having an open structured surface defining a microchannel closed by an essentially planar sheet shaped layer made from glass, ceramic or vitroceramic, and more particularly to such devices having improved sealing and ease of alignment during manufacturing.

TECHNICAL BACKGROUND

European patent application EP 1 964 817 to Corning Inc. teaches a method for fabricating microfluidic devices made from glass, ceramic or vitroceramic, by die casting of the material containing glass with heating to make the material viscous and to shape it to define a sheet having an open structure face provided to constitute a microfluidic channel. To produce the casting of this structured surface to form the microfluidic channel, a rigid mould is used, for example made from a graphite block (see the fabrication method of the mould and of the glass sheet, paragraphs [0044] and [0045]).

This document also describes the assembly of a plurality of microfluidic sheets comprising structured surfaces sealed together at 800° C. in air to constitute the microfluidic device (see paragraph [0047] to [0049]).

This microfluidic device made from glass, ceramic or vitroceramic can be used as a small-volume chemical reactor. The micro-processing chamber defined by a microfluidic channel is obtained by combining at least two glass, ceramic or vitroceramic layers or sheets sealed together.

It is therefore very important for the seal to be perfectly tight and for the two sheets or layers to be perfectly or nearly perfectly aligned during their stacking upon one another.

The sealing between the two glass, ceramic or vitroceramic sheets or layers stacked up on one another is generally carried out by depositing a glass, ceramic or vitroceramic frit on the surface to be sealed, followed by a thermal cycle to produce the viscous flow of the frit layer on the surface of the structures to be sealed and to remove the organic products which are generally present in the frit formulation.

A microfluidic device according to this document is shown in appended FIG. 1.

In addition to a proper alignment of the layers to be sealed, it is necessary to have a uniform coating of the surface to be sealed, in particular at the protuberances defining the sides of the microfluidic channel.

Document WO 2005/090227 also teaches a stack structure and a method for fabricating the same.

According to this document, the stacking of the microreactors 2 defining microchannels 2c is carried out by means of the combination of an electrically conducting buffer film and a layer in the form of a metal or metal alloy bonding film, for producing a bond by oxidation of the metal or of the alloy by the oxygen atoms contained in the glass structure 2 (see page 8, line 5 to pages 9 and 11), in particular. This oxidizing method is called an anode bonding method. This document proposes a solution which is very costly and which introduces the use of metals or alloys in a structure of microfluidic devices, whereas in the context of this disclosure, glass, ceramic or vitroceramic compositions are used essentially or exclusively, and the use of metal or alloy is to be avoided.

Document U.S. Pat. No. 6,600,558 B2 constitutes another document which describes the fabrication of a microfluidic cell for the optical detection of gas, which combines layers of glass such as Pyrex, which are sealed together, by means of a silicon nitride film by an anode bonding method (see column 8, lines 8 to 53 in particular).

Once again, the present disclosure is aimed to eliminate this type of fabrication which requires bonding by an anode method.

It is desirably to supply of a microfluidic device via a solution that allows an easy alignment of the open structures to be sealed, and which culminates in a uniform coverage of the surface of the protuberances of the processing microchannels.

SUMMARY

According to a first aspect, the present disclosure provides a microfluidic device made from glass, ceramic or vitroceramic, provided with at least one microfluidic processing channel defining at least one microfluidic processing chamber. The device comprises at least one upper layer, at least one lower layer, and at least one intermediate layer. The intermediate layer comprises an upper face and a lower face, and on its lower face has a first open structured surface in the form of a first network of protuberances defining a first microfluidic channel, and on its upper face has a second open structured surface in the form of a second network of protuberances defining a second microfluidic channel. The lower surface of the intermediate layer cooperates with a first essentially planar sheet shaped layer made from glass, ceramic or vitroceramic to close the first microchannel in a sealed manner and the upper face of the intermediate layer cooperates with a second essentially planar sheet shaped layer also made from glass, ceramic or vitroceramic, to close the second microfluidic channel in a sealed manner. The second essentially planar sheet shaped layer further constitutes an intermediate layer which cooperates, on its face opposite to the intermediate layer, with another layer comprising on its inner face a structured surface in the form of a network of protuberances defining a third microfluidic channel.

According to a particular embodiment of this disclosure, the microfluidic device is formed from a stack of layers, the stack comprising, in alternating order, an essentially planar sheet shaped layer and an intermediate layer, the intermediate layer having either one or two faces having an open structured surface in the form of a network of protuberances defining a microchannel.

According to another particular embodiment of this disclosure, the microfluidic device comprises microfluidic inlets and microfluidic outlets communicating fluidly with the microfluidic channels with the microfluidic inlets and outlets being arranged substantially opposite on the upper face and the lower face of the microfluidic device.

According to another particular embodiment of this disclosure, the composition of the glass, ceramic or vitroceramic structure and the composition of the essentially planar sheet shaped layer are essentially identical.

According to another particular embodiment of this disclosure, in which the device comprises fluid inlets and fluid outlets, wherein the device comprises means for aligning the various layers at the fluid inlets and outlets to produce the alignment of the intermediate layers and the essentially planar layers.

According to another particular embodiment of this disclosure, the aligning means comprise a stop and orifice system suitable for interpenetrating to produce the alignment.

According to another particular embodiment of this disclosure, the fluid inlets and outlets are provided with sealing means, for example O-rings.

According to another particular alternative embodiment of this disclosure, the intermediate layer comprises on at least one face the abovementioned open structure, and in a particular embodiment, an upper face having an open structure and a lower face having an open structure; and the intermediate layer and each essentially planar sheet shaped layer are tightly sealed together with a glass, ceramic or vitroceramic sealing frit deposited at least on the essentially planar sheet shaped layer.

According to a particular alternative embodiment of this disclosure, the glass, ceramic or vitroceramic sealing frit is deposited only on the essentially planar sheet shaped layer.

According to another particular alternative embodiment of this disclosure, the second microfluidic channel is provided to constitute a chemical reaction channel and at least one from the first and the third microfluidic channels is shaped to produce a flow of a heat exchange fluid.

The person skilled in the art understands that the deposition of the frit on the surface to be sealed and protected plays a critical role in the quality of the final coverage. An extensive deposit is required, and also on the surfaces which must not be sealed, because the chemical interdiffusion between the glass, ceramic or vitroceramic sealing frit and the glass, ceramic or vitroceramic structure may give rise to a lower chemical resistance of the surfaces affected. Due to the structures used, which have vertical walls to produce the microchannels, and which are difficult to cover properly, the operation may result in bare regions which are susceptible to preferential attacks of chemical agents.

This disclosure serves to solve this technical problem safely and reliably, by the deposition of the sealing frit at least on the essentially planar sheet shaped layer, thereby further limiting the interdiffusion during the sealing.

According to another particular feature of this disclosure, the sealing frit has a softening point that is at least 50° C. lower than the softening point of the glass, ceramic or vitroceramic used to prepare the structure of the microfluidic device, that is essentially the layers having structured surfaces defining the microchannels, and the essentially planar sheet shaped layers, and with a thermal expansion coefficient that is identical or similar.

According to another particular feature of this disclosure, the height of the protuberances is between 0.5 and 2 mm and the spacing between the protuberances is between 1 and 4 mm.

It could be understood that this disclosure serves to produce infinite combinations of stacks of microfluidic devices, without giving rise to manufacturing defects, or poor alignments of the protuberances defining the microchannels, with an essential uniform coverage of the surfaces by the sealing frit composition, giving rise to a perfect seal and a better resistance to the chemicals which may be used for the reactions in the processing chamber.

Furthermore, thanks to the use of an intermediate layer that comprises on each of its upper and lower surfaces protuberances defining microchannels on each face, this layer is prepared by pressure in a single step, making any poor alignment between two half-parts as in conventional processes impossible, and in particular, as in the prior document of the applicant EP 1 964 817.

In this way, the reaction volume and the shape of the processing chamber is practically no longer subject to a variability in the context of the present fabrication, since the closure of the channels is provided by an essentially planar surface. It is thus possible to avoid or decrease variability in pressure drop within a given reactor and from reactor to reactor.

Furthermore, by using a sealing frit which has a much lower softening point than that of the structure, and also a low viscosity, typically $10^6$ poises, which can be maintained during a sufficient period of time, for example during at least 1 h, the sealing composition flows and spreads on the compressed structures, the wetting and the coverage being particularly good with the glass, ceramic or vitroceramic structure. Thus, even acute angles are covered by a gentle-angle meniscus of the sealing glass frit composition. To improve the resistance of the sealed lines, the sealing temperature may also be selected so that the surface tension of the flow allows the formation of a meniscus that obscures the potentially acute or vertical angles that are harmful to the mechanical strength and which may be present on the apices of the protuberances of the structured layers.

As a glass, ceramic or vitroceramic composition, to manufacture said layers, compositions of glass of aluminosilicate family with vitrous transition temperature (viscosity of $10^{13.6}$ Poises) can be used.

A sealing frit composition that is particularly advantageous according to this disclosure is a glass, ceramic or vitroceramic of borosilicate family with vitrous transition temperature close to 500° C. having a coefficient of thermal expansion close to that of the substrate layers (difference of dilation coefficient lower than $10^{-6}$/° C.).

It is therefore understandable that with this disclosure, all the technical problems previously stated are solved simply, safely and reliably, and this disclosure is usable on the industrial scale.

This disclosure also comprises this second aspect, a method for fabricating the microfluidic device, and its use in the context of any type of processing, whether chemical reactions, or the detection of gas or other fluids, as is well known to a person skilled in the art.

The present disclosure will now be described with reference to the appended figures showing a currently preferred embodiment of this disclosure, provided simply for illustration and which is not at all limiting to the scope of this disclosure.

DESCRIPTION OF THE FIGURES

FIG. 1 shows a microfluidic device of the prior art as described in the prior document of the applicant EP 1 964 817 which comprises a microfluidic processing channel that is prepared by the joining of two intermediate layers having an open structure thereby comprising protuberances on their two upper and lower faces, while the upper face of the microfluidic device and the lower face of the microfluidic device are essentially planar and close the protuberances of the channels for allowing the passage of a heat exchange fluid in order to control the temperature in the processing chamber defined by the microfluidic processing channel.

FIG. 2 shows a first currently preferred embodiment of a microfluidic device according to the present disclosure, which comprises an intermediate layer with an open structure on its two faces, comprising on its upper face protuberances having a sufficient height to define the complete height of the processing chamber which is closed by an essentially planar sheet shaped layer, while the lower face of the intermediate layer also comprises protuberances, which are lower here and which define a microchannel for the heat exchange microfluid.

According to the embodiment shown, above the intermediate layer comprising the open structure for defining the processing microchannel, an upper layer is disposed comprising, on its lower face, protuberances having a height suitable for defining another channel also provided for the passage of the heat exchange fluid, in order to supplement the temperature control in the processing channel, on either side of the processing channel.

The structure in FIG. 2 thus shows alternating essentially planar sheets and layers comprising an open surface structure with protuberances.

FIG. 3 shows a cross section of the microfluidic device of this disclosure at an inlet or outlet orifice for fluid inlet or outlet connections;

FIG. 4 shows a plan view of the orifice in FIG. 3;

FIG. 5 shows a particular embodiment in which orifice sealing means are provided in the form of a ring sealed in the inlet or outlet orifice;

FIG. 6 shows a partial cross section of the microfluidic device of the present disclosure shown in FIG. 2, in which the interdiffusion line is shown and appears to be exposed to the chemicals only on the sides; and FIG. 7 shows a partial cross section similar to that of FIG. 6, but in which according to the advantageous embodiment of this disclosure, thanks to the use of a particular sealing frit, a meniscus is obtained between the sealing layer and the glass, ceramic or vitroceramic structure.

FIG. 1 shows a microfluidic device bearing the general reference number 10, as described in the prior document of the applicant EP 1 964 817, which comprises at least one microfluidic processing channel 12 which is produced by joining two intermediate layers 14, 16 having open structures, thereby comprising protuberances 15, 16 for the layer 14; and also protuberances 19, 20 for the layer 18, on their two upper and lower faces, as shown clearly in FIG. 1.

The upper face 22 of the microfluidic device 10; and the lower face 24 of the microfluidic device 10 are formed by essentially planar layers and close the protuberances of the channels 12, 26, 28 for allowing the passage either of a reaction fluid, or of a heat exchange fluid for controlling the temperature in the processing chamber defined by the microfluidic processing channel 12.

According to the prior art, this entire microfluidic device 10 is made from glass, vitroceramic or ceramic. The bonding between the various parts of the microfluidic structure is obtained by means of a glass, ceramic or vitroceramic sealing frit which has an adapted softening or melting point to provide a safe and reliable seal between the various parts.

It is understandable that in the embodiment of the prior art shown in FIG. 1, as described in the prior document of the applicant EP 1 964 817, a difficulty arises in the alignment of the opposing protuberances 16, 18 of the intermediate layers 14, 18.

FIG. 2, according to the present disclosure, shows a currently preferred embodiment of a microfluidic device 100 which here comprises an intermediate layer 114 which has an open structure on its two faces respectively 114a, 114b, comprising on its upper face 114b protuberances 120 having a sufficient height to define the complete height of the microfluidic channel 112 defined between the protuberances 120 and here constituting a processing chamber.

The processing chamber defined by the microfluidic channel 112 is closed by a new layer that is also an essentially planar sheet shaped intermediate layer 130. In the embodiment shown, the lower face 114a of the intermediate layer 114 also comprises protuberances 119, here for example having a lower height, and which define a microchannel 126 for a heat exchange microfluid for controlling the temperature in the processing chamber 112.

According to the embodiment shown in FIG. 2, currently preferred, above the intermediate layer 114 comprising the open structure 120 for defining the processing microchannel 112, an upper layer 122 is disposed comprising on its lower face 122a protuberances 123, having a height provided to define another channel 128 having a dimension also provided for the passage of another heat exchange fluid or of the same fluid, in order to supplement the temperature control in the processing channel 112 on either side of the processing channel 112.

It may be observed that the structure in FIG. 2 according to this disclosure shows alternating essentially planar sheets such as 124, 130 and layers such as 114, 122 comprising an open surface structure with protuberances.

It is understandable that this structure according to this disclosure clearly serves to obtain the technical advantages previously stated in the introductory part of the present description.

FIGS. 3 and 4 show a cross section of the microfluidic device 100 according to this disclosure at an inlet orifice 140 or outlet orifice for the fluid inlet or outlet connections, whether for the reaction fluid flowing in the microfluidic channel 112, or for the heat exchange fluid flowing in the heat exchange microchannel 126, 128.

FIG. 5 shows a similar cross section to FIG. 3 showing the presence in the orifice 140 of at least one sealing means 142 shown in a cross section in FIG. 5. This sealing means 142 for the orifice 140 is provided in the form of an O-ring joined or sealed in the inlet orifice 140 or the outlet orifice.

FIG. 6 shows a partial cross section of the microfluidic device 100 according to the present disclosure shown in FIG. 2, in which the interdiffusion line 150 is shown between the opposing surface of the intermediate layer 130 and a given protuberance 120 of the intermediate layer 114. It is clear that here, the interdiffusion line 150 appears to be exposed to the chemicals only on the sides of the protuberance 120.

FIG. 7, shows a partial cross section similar to that of FIG. 6 and in which according to an advantageous embodiment of this disclosure as shown in FIG. 2, thanks to the use of a glass, ceramic or vitroceramic sealing frit, having a particular composition, a meniscus 152 is obtained between the sealing layer not shown here and the glass, ceramic or vitroceramic structure consisting of the combination of the intermediate layer 130 and the protuberances 120 of the intermediate layer 114.

This sealing frit composition must have good durability or chemical resistance in itself, and must not create any durable weakness during the interdiffusion with the glass, ceramic or vitroceramic material of the structure. It must also have a compatibility in terms of thermal expansion coefficient to the glass, ceramic or vitroceramic structure to avoid tension after the sealing. This compatibility must be good, especially below the glass transition temperature of the seal used. The softening point of the frit composition is advantageously at least 50° C. lower than the softening point of the glass structure to avoid any significant deformation of the microfluidic channels during the sealing cycle.

It is understandable that thanks to this disclosure, the structure of the prior art as shown in FIG. 1 has been simplified by making it the intermediate layer 120 of a single piece, comprising on its two respectively upper and lower faces, an open structure comprising protuberances for defining respectively on one side the processing channel 112 and on the other side of the heat exchange channel 126 and that the protuberances respectively 114 and 119 of the intermediate layer 120 rest on an essentially planar surface provided by the intermediate layer 130 or the essentially planar lower layer 124. With this structure, there is no risk of misalignment of the protuberances facing other protuberances as was the case previously in the structure of the prior art device shown in FIG. 1.

Furthermore, the upper layer 122 comprises a lower surface 122a which here comprises protuberances 123 defining the heat exchange microfluid flow channel 128, these protuberances 123 also resting on an essentially planar face consisting of the essentially planar sheet 130.

In these conditions, the procedure for fabricating the microfluidic structure of the microfluidic device according to this disclosure 100 is simplified, made more efficient, and the assembly procedure may be much faster while remaining safe and reliable and ensuring a perfect seal, and even improving the service life of the structure and improving its resistance to chemical agents.

An exemplary embodiment of a structure according to this disclosure provides for fabricating the intermediate layer 114 of glass, ceramic or vitroceramic comprising open protuberances 119, 120 having a size provided to constitute microchannels 112 on each side of its faces 114a, 114b, thus typically having a height of 0.5 to 2 mm and a spacing of 2 to 4 mm, using a graphite mould machine to produce the negative form of the desired glass structure, as is well known to a person skilled in the art and in particular from the prior patent of the applicant EP 1 964 817. This casting procedure is typically carried out at a viscosity in the range of $10^5$-$10^6$ Poises for 0.5 to 2 hours.

The same procedure is followed for the upper layer 122 comprising protuberances 123.

The intermediate layer 130 and the lower layer 124 are made in the form of essentially planar sheets having the same glass, ceramic or vitroceramic composition.

As a glass, ceramic or vitroceramic composition, to manufacture said layers, compositions of glass of aluminosilicate family with vitrous transition temperature close to 800° C. (viscosity of $10^{13.6}$ Poises) can be used.

As a sealing frit, use can be made of a glass, ceramic or vitroceramic of borosilicate family with vitrous transition temperature close to 500° C. having a coefficient of thermal expansion close to that of the substrate layers (difference of dilation coefficient lower than $10^{-6}$/° C.).

The sealing procedure can thus be carried out at a temperature close of the softening point of the glass frit, namely 850-900° C., for a period of about 2 hours.

It is therefore understood that this disclosure serves to solve all the technical problems previously described, simply, reliably, and is usable on the industrial scale.

The methods of use and/or the devices disclosed herein are generally useful in performing any process that involves mixing, separation, extraction, crystallization, precipitation, or otherwise processing fluids or mixtures of fluids, including multiphase mixtures of fluids—and including fluids or mixtures of fluids including multiphase mixtures of fluids that also contain solids—within a microstructure. The processing may include a physical process, a chemical reaction defined as a process that results in the interconversion of organic, inorganic, or both organic and inorganic species, a biochemical process, or any other form of processing. The following non-limiting list of reactions may be performed with the disclosed methods and/or devices: oxidation; reduction; substitution; elimination; addition; ligand exchange; metal exchange; and ion exchange. More specifically, reactions of any of the following non-limiting list may be performed with the disclosed methods and/or devices: polymerisation; alkylation; dealkylation; nitration; peroxidation; sulfoxidation; epoxidation; ammoxidation; hydrogenation; dehydrogenation; organometallic reactions; precious metal chemistry/homogeneous catalyst reactions; carbonylation; thiocarbonylation; alkoxylation; halogenation; dehydrohalogenation; dehalogenation; hydroformylation; carboxylation; decarboxylation; amination; arylation; peptide coupling; aldol condensation; cyclocondensation; dehydrocyclization; esterification; amidation; heterocyclic synthesis; dehydration; alcoholysis; hydrolysis; ammonolysis; etherification; enzymatic synthesis; ketalization; saponification; isomerisation; quaternization; formylation; phase transfer reactions; silylations; nitrile synthesis; phosphorylation; ozonolysis; azide chemistry; metathesis; hydrosilylation; coupling reactions; and enzymatic reactions.

The embodiments shown in the FIGS. 1 to 7 are an integral part of this disclosure and are to be construed only as examples. Various changes of form, design, or arrangement may be made to this disclosure without departing from the spirit and scope of this disclosure that is defined by the following claims.

The invention claimed is:

1. Microfluidic device (100) made from glass, ceramic or vitroceramic, provided with at least one microfluidic processing channel defining at least one microfluidic processing chamber (112), the device comprising at least one upper layer (122), at least one lower layer (124) and at least one intermediate layer (114), wherein the intermediate layer (114) comprises an upper face (114b) and a lower face (114a), and wherein the intermediate layer (114) comprises on its lower face (114a) a first open structured surface in the form of a first network of protuberances (119) defining a first microfluidic channel (126) and on its upper face (114b), a second open structured surface in the form of a second network of protuberances (120) defining a second microfluidic channel (112); the lower surface of the intermediate layer (114) cooperating with a first essentially planar sheet shaped layer (124) made from glass, ceramic or vitroceramic, closing the first microchannel (126) in a sealed manner; the upper face (114b) of the intermediate layer (114) cooperating with a second essentially planar sheet shaped layer (130), also made from glass, ceramic or vitroceramic, closing the second microfluidic channel (112) in a sealed manner, and wherein the second essentially planar sheet shaped layer constitutes an intermediate layer (130) which cooperates, on its face opposite to the intermediate layer (114), with another layer (122) comprising on its inner face (122a) a structured surface in the form of a network of protuberances (123) defining a third microfluidic channel (128).

2. Microfluidic device according to claim 1, in which the microfluidic device (100) is formed from a stack of layers, the stack comprising, in alternating order, an essentially planar sheet shaped layer (124; 130) and an intermediate layer (114; 122), the intermediate layer having either one or two faces (114*a*, 114*b*, 122*a*) having an open structured surface in the form of a network of protuberances (119, 120, 123) defining a microchannel, (126, 112, 128).

3. Microfluidic device according to claim 1, wherein the microfluidic device comprises microfluidic inlets (such as 140) and microfluidic outlets communicating fluidly with the microfluidic channels (such as 126; 112; 128), the microfluidic inlets and outlets, being arranged substantially opposite on the upper face (122) and the lower face (124) of the microfluidic device (100).

4. Microfluidic device according to claim 1, wherein the composition of the glass, ceramic or vitroceramic structure and the composition of the essentially planar sheet shaped layer are essentially identical.

5. Microfluidic device according to claim 1, in which the device comprises fluid inlets and fluid outlets, and wherein the device comprises a stop and orifice system to produce the alignment of the intermediate layers and the essentially planar layers.

6. Microfluidic device according to claim 5, wherein the fluid inlets and outlets are provided with sealing means (142).

7. Microfluidic device according to claim 1, wherein the intermediate layer and each essentially planar sheet shaped layer (124; 130) are tightly sealed together with a glass, ceramic or vitroceramic sealing frit deposited at least on the essentially planar sheet shaped layer.

8. Microfluidic device according to claim 7, wherein the glass, ceramic or vitroceramic sealing frit (150, 152) is deposited only on the essentially planar sheet shaped layer (124; 130).

9. Microfluidic device according to claim 1, wherein the second microfluidic channel (112) is structured and arranged as a chemical reaction channel, and wherein at least one from the first (126) and the third (128) microfluidic channels is structured and arranged as heat exchange fluid channel.

\* \* \* \* \*